United States Patent
Hirabayashi et al.

[11] Patent Number: 6,133,763
[45] Date of Patent: Oct. 17, 2000

[54] HIGH IMPEDANCE CIRCUIT

[75] Inventors: Atsushi Hirabayashi, Tokyo; Kosuke Fujita; Kenji Komori, both of Kanagawa; Norihiro Murayama, Chiba, all of Japan

[73] Assignee: Sony Corporation, Tokyo, Japan

[21] Appl. No.: 09/154,096

[22] Filed: Sep. 16, 1998

[30] Foreign Application Priority Data

Sep. 29, 1997 [JP] Japan ................................. 9-263962

[51] Int. Cl.$^7$ ................................................ H03K 5/153
[52] U.S. Cl. ........................... 327/55; 327/54; 327/67
[58] Field of Search ................................. 327/52, 56, 57, 327/63, 65, 54, 55, 67

[56] References Cited

U.S. PATENT DOCUMENTS

| | | | |
|---|---|---|---|
| 4,667,166 | 5/1987 | Itoh | 330/260 |
| 4,904,952 | 2/1990 | Tanimoto | 330/252 |
| 5,138,318 | 8/1992 | Matsuzawa | 341/156 |
| 5,329,173 | 7/1994 | Murakami et al. | 327/63 |
| 5,465,070 | 11/1995 | Koyama et al. | 327/350 |
| 5,554,943 | 3/1996 | Moreland | 327/65 |
| 5,587,674 | 12/1996 | Danstrom | 327/67 |
| 5,614,860 | 3/1997 | Osaki et al. | 327/552 |

*Primary Examiner*—Terry D. Cunningham
*Attorney, Agent, or Firm*—Ronald P. Kananen; Rader, Fishman & Grauer

[57] ABSTRACT

A high impedance circuit capable of operating at a low voltage without narrowing the dynamic range is provided, which includes a first and a second transistors forming differential-pair type circuit, a third and fourth transistors, a pair of collector resistance elements, a resistance element and a pair of current source circuits. The third and the fourth transistors serve as emitter follower circuits which also functions as a DC shift with respect to the differential-pair type circuit, as well as buffer circuits for heightening an input impedance of the first and the second transistors looked from the base side of the third and the fourth transistors. The current flowing in the resistance element is made current-fedback with respect to the resistance elements by the third and the fourth transistors. The input impedance is determined as $Z1=V1/i3=(R1 \times R2)/(R1-R2)$, and when $R1=R2$, the high impedance circuit becomes infinite impedance.

3 Claims, 4 Drawing Sheets

HIGH IMPEDANCE CIRCUIT

BACKGROUND OF THE INVENTION

1. Field of the Invention

The present invention relates to a high impedance circuit used as, for example, a signal input circuit, and particularly relates to a high impedance circuit and a high gain amplifier which are suitably used as a signal input circuit for a high frequency signal, such as a radio receiver, a television receiving set, a satellite broadcasting receiver, a video recorder and a mobile communication device.

2. Description of the Related Art

It is necessary that a signal input circuit has a high impedance. In addition, since a high speed operation is required to a signal input circuit used for a high frequency signal such as a signal for a radio receiver, a video signal for a television receiving set, a high frequency signal for a satellite broadcasting receiver, a video signal for a video recorder and an RF signal for a mobile communication device, normally such circuit is formed as a high impedance circuit having a differential-pair type circuit.

As a background art of the high impedance circuit of the present invention, an example of a differential-pair type high impedance circuit having a differential-pair circuit which is suitable to a signal input circuit for a high frequency signal will be explained below with reference to FIG. 1.

Figure 1:
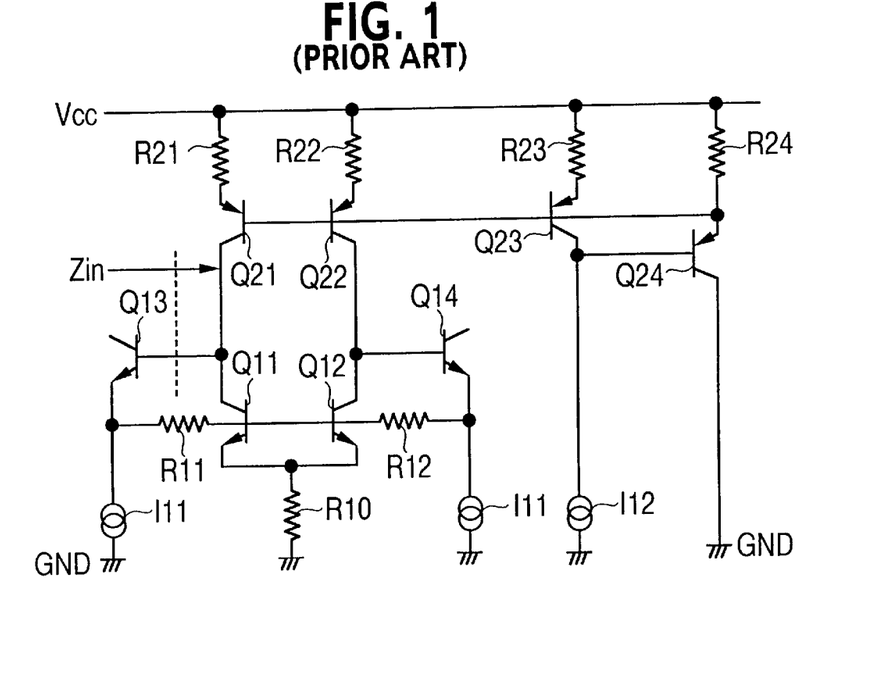
FIG. 1 is a circuit diagram of a high impedance circuit as a background art of the present invention

FIG. 1 is a circuit diagram of a differential-pair type high impedance circuit as a background art of the high impedance circuit of the present invention.

This differential-pair type high impedance circuit comprises npn-type transistors Q11 and Q12 composing a differential-pair type circuit, both of the emitters are commonly connected and grounded to the ground potential GND via a resistance element R10. Bases of the npn-type transistors Q11 and Q12 are commonly connected and further connected to resistance elements R11 and R12. The high impedance circuit further comprises an npn-type transistor Q13 whose base is connected to the collector of the npn-type transistor Q11 and the emitter is connected to the base of the npn-type transistor Q11 via a current source circuit I11 and the resistance element R11, and an npn-type transistor Q14 whose base is connected to the collector of the npn-type transistor Q12 and the emitter is connected to the base of the npn-type transistor Q12 via the current source circuit I11 and the resistance element R12.

The high impedance circuit further comprises pnp-type transistors Q21 and Q22 connected to the collectors of the npn-type transistors Q11 and Q12, and resistance elements R21 and R22 connected between the transistors Q21 and Q22 and a first potential power source line Vcc in order that the differential-pair type circuit becomes high impedance. The base of the transistor Q21 and the base of the transistor Q22 are commonly connected. These pnp-type transistors Q21 and Q22 and the resistance elements R21 and R22 function as a direct current (DC) power source for the differential-pair type circuit.

The high impedance circuit is further provided with pnp-type transistors Q23 and Q24, resistance elements R23 and R24 connected to the emitters of these pnp-type transistors Q23 and Q24, and a current source circuit I12 for these circuits.

In this high impedance circuit, an input impedance Zin looked from the npn-type transistor Q13 is very high.

In the high impedance circuit shown in FIG. 1, the high impedance components depend on collector impedance of the transistors Q11 and Q12, that is, the impedance by circuits such as the pnp-type transistors Q21 and Q22. Accordingly, a bias is needed for providing direct current (DC) power sources at upper and under portions of the differential-pair type circuit in the high impedance circuit. Due to the bias, there arises a scale reduction of a dynamic range of more than about 1 V, on the voltage of the first potential power source Vcc and the second potential power source GND. As a result, this high impedance circuit is not suitable for a low voltage operation.

Particularly, in a recent high impedance circuit for a high frequency signal, a wide dynamic range and operation at further lower voltage are required, therefore, the above disadvantage may be become large on a high impedance circuit for a high frequency operation.

Also, since the npn-type transistors Q11 to Q14 are used together with the pnp-type transistors Q21 to Q24 having an opposite polarity in the high impedance circuit in FIG. 1, it becomes complicated when manufacturing one integrated circuit (IC) accommodating these circuits.

SUMMARY OF THE INVENTION

An object of the present invention is to provide a high impedance circuit operatable at a low voltage and whose dynamic range is not reduced.

Another object of the present invention is to provide a high impedance circuit easy to be manufactured and suitable for forming an IC.

According to the present invention, there is provided a high impedance circuit, comprising; a first transistor, a first resistance element connected between one terminal of the first transistor and a first voltage power supply line, a first current source connected between another terminal of the first transistor and a second voltage power supply line, a second transistor having a characteristic same as that of the first transistor, a second resistance element connected between one terminal of the second transistor and the first voltage power supply line and having a resistance value same as that of the first resistance element, a second current source connected between another terminal of the second transistor and the second voltage power supply line and having a characteristic same as that of the first current source, a third resistance element connected between another terminal of the first transistor and another terminal of the second transistor, a first buffer circuit element connected between the one terminal of the second transistor and a control terminal of the first transistor, and a second buffer circuit element connected between the one terminal of the first transistor and a control terminal of the second transistor, and a half of a resistance value of the third resistance element being larger than and close to a resistance value of the respective first resistance element and second resistance element.

Working of a Basic High Impedance Circuit

The above first and second transistors compose a differential-pair type circuit. In this differential-pair type circuit, the first and the second buffer circuits serve as a direct current (DC) bias circuit. Furthermore, in order that the third resistance element connected between the other ends of the first and the second transistors feedbacks as a negative resistance, a control terminal of transistors in the differential-pair type circuit, for example, a base voltage is bias-shifted to one terminal of transistors in differential-pair type circuit, for example, to a collector. Namely, the high impedance circuit of the present invention operates as a current feedback circuit.

In order that the high impedance circuit of the present invention has as large impedance as possible, it is preferable to set the resistance value (R2) of the first resistance element (R2) and the second resistance element (R2) larger than half the resistance value of the third resistance element (2R1) and, at a time, close to the value of the first resistance element (R2) and the second resistance element (R2).

Preferably, the first transistor is an npn-type bipolar transistor, and the second transistor is an npn-type bipolar transistor. preferably, the first buffer circuit element includes a third transistor, whose one base is connected to a collector of the second transistor and an emitter is connected to a base of the first transistor, and having a same conductivity of the first transistor, and a third current source circuit connected between an emitter of the third transistor and the second voltage source, and wherein the second buffer circuit element includes a fourth transistor, whose one base is connected to a collector of the first transistor and an emitter is connected to a base of the second transistor, and having a same conductivity of the second transistor, and a fourth current source circuit connected between an emitter of the fourth transistor and the second voltage source, and being equal to the third current source.

In the above circuit configuration, the third and the fourth transistors are used for a DC shift portion (a buffer circuit element) for a bias in the high impedance circuit.

As a second embodiment of the high impedance circuit of the present invention, preferably, the high impedance circuit of the above first working can function as a high gain amplifier by adding a circuit below.

Preferably, the high impedance circuit according to the present invention further comprises a fifth npn-type transistor having a collector connected to the collector of the first transistor and a base of the fourth transistor; a sixth npn-type transistor having a collector connected to the collector of the second transistor and the base of the third transistor and having a same conductivity to the fifth transistor; a fifth current source circuit connected between the emitter of the fifth transistor and the second voltage source; a fifth current source circuit connected between the emitter of the sixth transistor and the second voltage source; a sixth resistance element connected between the emitter of the fifth transistor and the emitter of the sixth transistor; and a sixth resistance element connected between the collector of the first transistor and the collector of the second transistor.

Preferably, a ratio of the resistance value of the sixth resistance element and the resistance value of the fifth resistance element is defined to set a desired amplification of the circuit.

Preferably, the first buffer circuit element includes a fourth resistance element connected to a collector of the second transistor and an emitter is connected to a base of the first transistor, and a third current source circuit connected between a connection point of another terminal of the fourth resistance element and the base of the first transistor and the second voltage source, and wherein the second buffer circuit element includes a fifth resistance element connected between a collector of the first transistor and the base of the second transistor, and having a same resistance value to the fifth resistance element, and a fourth current source circuit connected between a connection point of another terminal of the fifth resistance element and a base of the second transistor and the second voltage source, and being equal to the third current source.

In this circuit configuration, the fourth and the fifth resistance elements are used for the DC shift portion (a buffer circuit element) for a bias in the high impedance circuit.

As a fourth embodiment of the present invention, preferably, the high impedance circuit of the above third embodiment can function as a high gain amplifier by adding a circuit below.

Preferably, the high impedance circuit according to the present invention further comprises: a fifth npn-type transistor having a collector connected to a connection point of the collector of the first transistor and the fourth resistance element; a sixth npn-type transistor having a collector connected to a connection point of the collector of the second transistor and the fifth resistance element; a fifth current source circuit connected between the emitter of the fifth transistor and the second voltage source; a sixth current source circuit connected between the emitter of the sixth transistor and the second voltage source and being equal to the fifth current source circuit; a fifth resistance element connected between the emitter of the fifth transistor and the emitter of the sixth transistor; and a sixth resistance element connected between the collector of the first transistor and the collector of the second transistor.

Also, in this circuit, an additional differential-pair type circuit is composed by a fifth and a sixth transistors. In this circuit, to bridge the sixth resistance element to the high impedance bias portion as a load resistance and the sixth resistance element as an additional resistance element can be current driven by a newly provided additional differential-pair type circuit.

Preferably, a ratio of the resistance value of the sixth resistance element and the resistance value of the fifth resistance element is defined to set a desired amplification of the circuit.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, various preferred embodiments of the high impedance circuit of the present invention will be described with reference to the accompanying drawings.

First Embodiment

Figure 2:
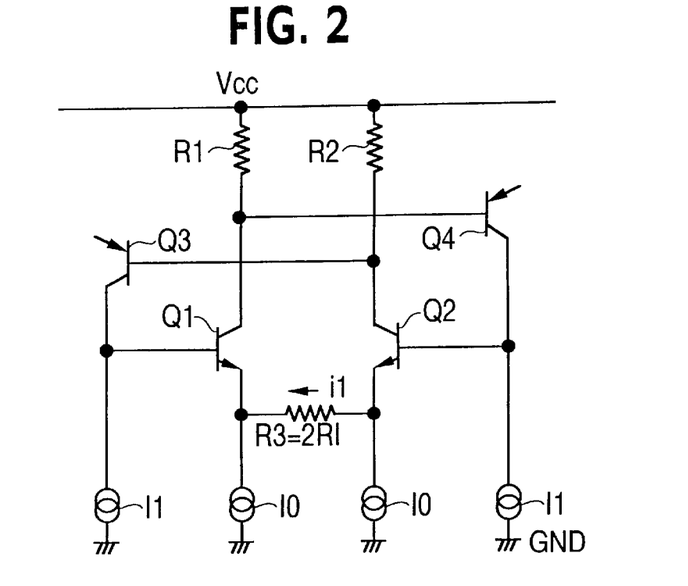
FIG. 2 is a circuit diagram of a high impedance circuit according to a first embodiment of the present invention.

FIG. 2 is a circuit diagram of a differential-pair type high impedance circuit according to the first embodiment of the high impedance circuit of the present invention.

The circuit configuration of the high impedance circuit shown in FIG. 2 will be explained. This high impedance circuit comprises npn-type transistors Q1 and Q2 having the same characteristics, npn-type transistors Q3 and Q4 having the same characteristics, resistance elements R1 and R2 having the same resistance value and connected to the collectors of the transistors Q1 and Q2, a resistance element R3 (=2R1) connected between an emitter of the transistor Q1 and an emitter of the transistor Q2, two current source circuits I0 and two current source circuits I1.

The transistor Q1 corresponds to the first transistor of the present invention, the transistor Q2 corresponds to the second transistor of the present invention, resistance elements R1 and R2 correspond to the first and the second resistance elements of the present invention, the resistance element 2R1 corresponds to the third resistance element of the present invention, and the two current source circuits I0 and I0 correspond to the first, and the second current source circuits of the present invention. Also, the transistor Q3 corresponds to the third transistor of the present invention, the transistor Q4 corresponds to the fourth transistor of the present invention, and the two current source circuits I1 and I1 correspond to the third and the fourth power source circuits of the present invention.

The power source Vcc corresponds to the first potential power source of the present invention and the ground potential GND corresponds to the second potential power source of the present invention.

In the high impedance circuit shown in FIG. 2, the npn-type transistor Q1 and Q2 having the same polarity (same conductivity) and the same characteristics form the differential-pair type circuit. The first current source circuits I0 and I0 are connected between the respective emitter of the transistors Q1, Q2 and the ground potential GND as the second potential power source, and the resistance elements R1 and R2 are connected between the collectors of the transistors Q1, Q2 and the first potential power source line Vcc as collector resistance elements.

In this high impedance circuit, the base of the npn-transistor Q3 is connected to the collector of the transistor Q2 and the emitter of the transistor Q3 is connected to the base of the transistor Q1 and the second current source circuit I1. In FIG. 1, the base of the npn-type transistor Q13 is connected to the collector of the npn-type transistor Q11, while, in the high impedance circuit in FIG. 2, the base of the transistor Q3 is connected to the collector of the npn-type transistor Q2 which is positioned at the opposite side of the transistor Q1.

Similarly, in this high impedance circuit, the base of the npn-type transistor Q4 is connected to the collector of the transistor Q1 and the emitter of the transistor Q4 is connected to the base of the transistor Q2 and the current power source circuit I1. Also the same as above, the base of the npn-type transistor Q14 is connected to the collector of the npn-type transistor Q12 in FIG. 1, while, in the high impedance circuit in FIG. 2, the base of the transistor Q4 is connected to the collector of the npn-type transistor Q1 which is positioned at the opposite side of the transistor Q2.

The bases of transistors Q1 and Q2 are respectively connected to the emitters of the transistors Q3 and Q4.

In the high impedance circuit shown in FIG. 2, the emitter of the transistor Q1 and the emitter of the transistor Q2 are commonly connected by the resistance element 2R1. This resistance element 2R1 functions as a negative resistance element which will be explained later.

The high impedance circuit shown in FIG. 1 and the present high impedance circuit will be compared in terms of the circuit configuration. In the high impedance circuit shown in FIG. 2, only npn-type transistors Q1 to Q4 are used. Therefore, this circuit configuration is easy to be manufactured when being realized as one integrated circuit (IC). Furthermore, the high impedance circuit shown in FIG. 2 does not comprises the pnp-type transistors Q21 to Q24, the resistance elements R21 to R24 accompanying to these transistors, and the current source circuit I12 of the high impedance circuit shown in FIG. 1. Therefore, the high impedance circuit shown in FIG. 2 has a very simple configuration.

In the high impedance circuit shown in FIG. 2, the transistors Q3 and Q4 respectively function as an emitter follower circuits functioning as a DC shift circuit to the transistors Q1 and Q2 composing the differential-pair type circuit. Moreover, Q3 and Q4 serve as buffer circuits to heighten the input impedance Z1 of the transistors Q1 and Q2 looked from the base side of the transistors Q3 and Q4.

By providing the transistors Q3 and Q4, the current i1 flowing in the transistors Q1 and Q2 and the resistance elements 2R1 between the emitters of the transistors Q1 and Q2 is fed back with respect to the resistance elements (referred to as collector elements hereinafter) R1 and R2 of the collector side of the transistors Q1 and Q2.

The above current-feedback phenomenon in the high impedance circuit in FIG. 2 will be explained with reference to FIG. 3.

Figure 3:
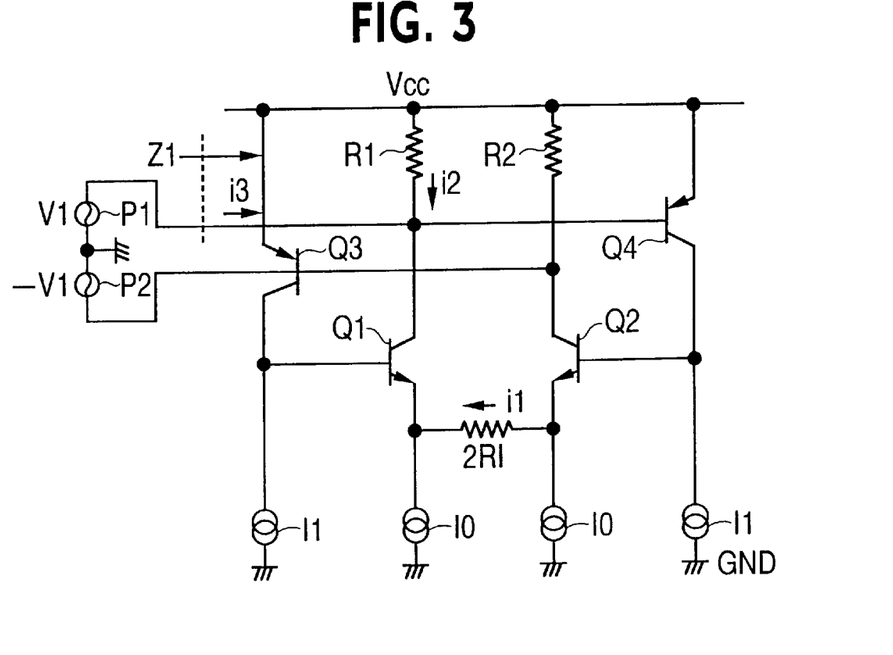
FIG. 3 is a circuit diagram for explaining the operation of the high impedance circuit shown in FIG. 2.

FIG. 3 is a circuit diagram showing a circuit wherein an AC power sources P1 and P2 are provided in order to provide a differential input signal dV1 on a voltage of V1 and a differential input signal −dV1 on a voltage of −V1 between the bases of transistors Q3 and Q4. Namely, the high impedance circuit shown in FIG. 2 is used, for example, in the circuit having the configuration shown in FIG. 3.

Assuming that the input current flowing in the direction of the base of the transistor Q4 is expressed as i3 when outputting the voltage V1 from the power source P1, the input impedance Z1 looked from the power source P1 can be expressed by the following formula.

$$i3+(0-V1)/R2=-V1/R1$$

where, i3 represents a current flowing in the direction of the base of the transistor Q4 from the power source P1, V1 represents the voltage of the differential input signal dV1 output from the power source P1, −V1 represents the voltage of the differential input signal −dV21 output from the power source P2, R1 represents the resistance value which is a half the resistance element 2R1 connected between the emitters of the transistor Q1 and the transistor Q2, and R2 represents a resistance value of the collector resistance element R2.

For convenience, a resistance element, for example the resistance element R2 and its resistance value are referred to using a same reference number R2. It is the same for other resistance elements, as well.

The following formula is the rearrangement of the above formula.

$$i3 = V1(1/R2 - 1/R1)$$
$$= V1 \times (R1 - R2)/(R1 \times R2)$$

Accordingly, the input impedance Z1=V1/i3 can be expressed by the following formula (1).

$$Z1 = V1/i3 = (R1 \times R2)/(R1-R2) \qquad (1)$$

It can be understood from the formula (1) that, in the high impedance circuit in FIG. 3, the resistance element −R1 and the resistance element R2 exist in parallel with respect to the power source P1, that is, with respect to the input signal equivalently. Namely, as is clear form the formula (1), it means that the current is fedback by the resistance element having the resistance value R1 which is a half the value of the resistance element 2R1 between the emitters with respect to the collector resistance element R2. Accordingly, the resistance element having the resistance value R1 which is a half the value of the resistance element 2R1 functions as a negative resistance element −R1.

In other words, the resistance element 2R1 between the emitters connected between the emitters of transistors Q1 and Q2 becomes a negative resistance element functioning as a current feedback element at the resistance value of half the resistance value 2R1.

Due to this negative resistance element, the high impedance circuit shown in FIGS. 2 and 3 realizes a circuit having a high impedance. The detailed explanation will be given below.

An explanation will now be made of the conditions which maximize the input impedance Z1 the maximum by the relationship between the resistance element between emitters (a negative resistance element) 2R1 and the resistance value of the collector resistance element R2.

In the formula (1), when R1=R2, the input impedance Z1 looked from the power source P1 becomes the maximum impedance. Accordingly, if R1=R2, the high impedance circuit shown in FIG. 2 becomes an ideal high impedance circuit wherein the input impedance Z1 becomes the maximum.

Actually, however, the condition of R1=R2 can not be satisfied completely. It is because, for example, the resistance values are not uniform due to the manufacturing process, or changes of resistance arises due to changes of the temperature.

What should be noted here is the absolute values of the resistance value R1 of the negative resistance element (a resistance element between emitters) R1 and the resistance value R2 of the collector resistance element R2. When the resistance value R1 of the negative resistance element R1 is larger than the resistance value R2 of the collector resistance element R2, the input impedance Z1 looked from the power source P1 indicates a high impedance in the positive direction. Conversely, when the resistance value R2 of the collector resistance element R2 is larger than the resistance value R1 of the negative resistance element R1, the input impedance Z1 looked from the power source P1 indicates a high impedance in the negative direction. When the input impedance Z1 is in the negative direction, if an electrostatic capacitance components (condenser), etc. are connected in parallel with respect to the input impedance Z1, the high impedance circuit oscillates (diverges) which causes a latching up on a circuit. Therefore, it is necessary to fulfill the condition given in the following formula (2), when forming a high impedance circuit using the formula (1).

$$R1 > R2 \qquad (2)$$

Under this condition, when the resistance value R1 which is half the resistance value of the negative resistance element 2R1 is made close to the resistance value R1 of the collector resistance element R1, the high impedance circuit shown in FIG. 2 becomes a signal input circuit of a high impedance.

A base bias of the transistors Q3 and Q4 is indicated in the following formula (3).

$$(A \text{ base bias of } Q3 \text{ and } Q4) = Vcc - I0 \times R2 \qquad (3)$$

Figure 4:
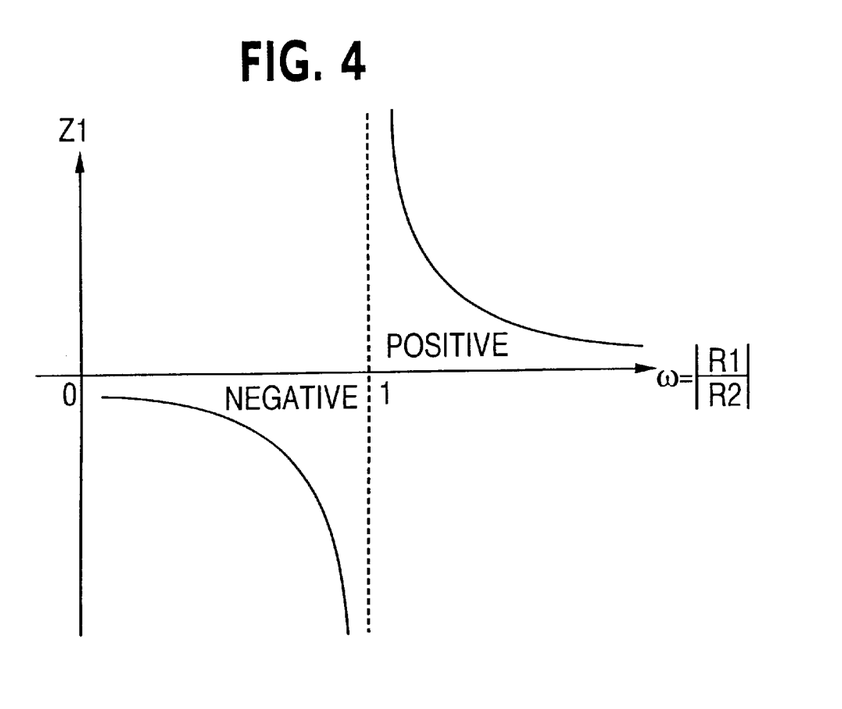
FIG. 4 is a graph showing impedance characteristics of the high impedance circuit shown in FIG. 2.

FIG. 4 is a graph showing the characteristics of the input impedance Z1 when the ratio of the absolute value of R1 to the absolute value of R2 is normalized as $\omega = |R1|/|R2|$. When $\omega=1$, that is, when the resistance value R1=the resistance value R2, the input impedance of the high impedance circuit becomes the maximum and the curve of the input impedance Z1 becomes a hyperbolic curve whose mid point is $\omega=1$.

As explained above, in the first embodiment of the high impedance circuit of the present invention, the high impedance circuit is equivalently configured by using the negative resistance element 2R1 connecting the emitters of the transistors Q1 and Q2 composing the differential-pair type circuit. As a result, as shown in the example of the technical background with reference to FIG. 1, a high impedance circuit having a high impedance bias which is suitable to a low voltage can be produced in one IC without using pnp-type transistors.

Also, according to the first embodiment of the high impedance circuit of the present invention, by connecting resistance elements RL and RL between the high impedance biases on the collector side of the transistors Q1 and Q2, the it becomes a resistance element of zero bias current, and a high gain circuit which has been difficult to be formed can be structured. Therefore, according to the high impedance circuit of the first embodiment of the present invention, it is possible to raise a gain per one stage of an amplifier constituted by npn-type transistors, and the number of the element in an IC can be reduced, an S/N (signal/noise ratio) can be improved, and the circuit area can be reduced in more complicated circuits.

That is, the high impedance circuit of the first embodiment is high impedance and capable of giving an appropriate bias, furthermore, has an advantage of being differential. Therefore, comparing with the high impedance circuit shown in FIG. 1, the amplifying gain can be drastically raised and though being a high impedance circuit, it can realize a high gain amplifier simultaneously with a low power consumption at a time.

Since the high impedance circuit of the first embodiment does not need a direct current power source by pnp-type transistors as shown in FIG. 1, it can secure a wide dynamic range, and, consequently, it is operatable at a low voltage.

As a result of the above advantages, the high impedance circuit according to the first embodiment of the present invention can realize high quality, low power consumption, reduction of the size of an IC chip size and an IC cost, and a largely reduced manufacturing cost.

Also, according to the first embodiment of the present invention, the range of application can be widened by producing a high impedance bias and it can be used as a wide range signal input circuit for a phase-locked loop circuit (PLL), an amplitude wave detection circuit (AMDET), a frequency wave detection circuit (FMDET), a filter circuit (FILTER), etc.

Note that it is already explained above that the high impedance circuit shown in FIGS. 2 and 3 has a simpler circuit configuration comparing with the high impedance circuit shown in FIG. 1.

Second Embodiment

An explanation will be made of a high impedance circuit according to a second embodiment of the present invention.

Figure 5:
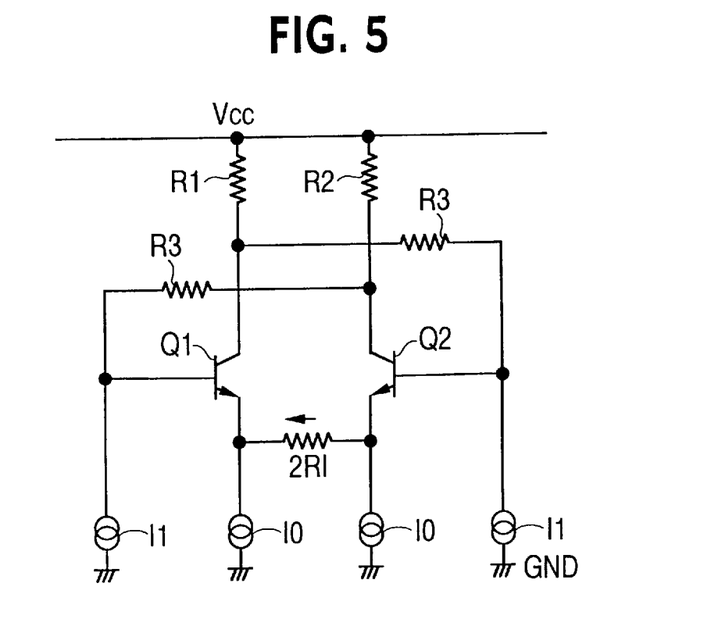
FIG. 5 is a circuit diagram of the high impedance circuit according to the second embodiment of the present invention.

FIG. 5 is a circuit diagram showing an example of the high impedance circuit according to the second embodiment of the present invention.

A circuit configuration of the high impedance circuit shown in FIG. 5 will be explained. The high impedance circuit according to the second embodiment of the present invention has a configuration that the npn-type transistors Q3 and Q4 for buffers in the high impedance circuit shown in FIG. 2 are removed, and that the resistance elements R3 and R3 also serving as DC shifts of the differential-pair type circuit are connected between the collector of the npn-type transistor Q1 and the base of the npn-type transistor Q2 and between the collector of the npn-type transistor Q2 and the base of the npn-type transistor Q1.

The remaining circuit configuration is the same as that in the high impedance circuit shown in FIG. 2. Also, as to the basic configuration, the high impedance circuit according to the first embodiment shown in FIG. 2 can be applied to the high impedance circuit shown in FIG. 5. Namely, the high impedance circuit shown in FIG. 5 comprises transistors Q1 and Q2, whose collectors are connected to the resistance elements R2 and R2, and differential-pair type circuit having current source circuits I0 and I0 of the transistors Q1 and Q2, and the emitters of the transistors Q1 and Q2 composing differential-pair type circuit are connected by the negative resistance element 2R1.

Figure 6:
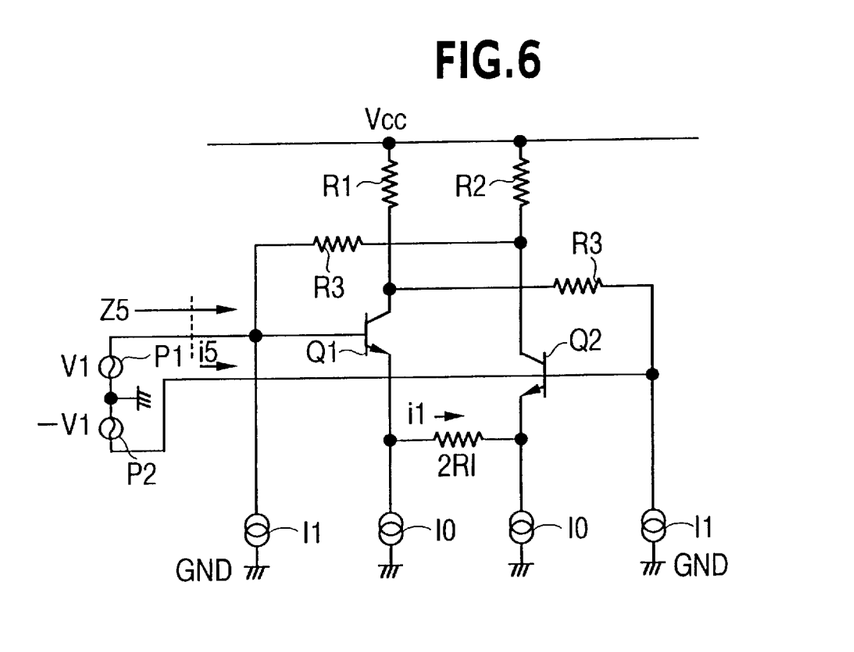
FIG. 6 is a circuit diagram for explaining the operation of the high impedance circuit shown in FIG. 5.

FIG. 6 is a circuit diagram showing the operation of the high impedance circuit shown in FIG. 5.

In FIG. 6, as same as in FIG. 3, AC (alternating current) power sources P1 and P2 are provided between the bases of the transistors Q1 and Q2 to supply differential input signals V1 and −V1.

In the circuit shown in FIG. 6, the obtained result of an input impedance Z5 when looking at the base of the transistor Q1 from the power source P1 is indicated below in the same way as in the circuit in FIG. 3.

$$i5 = V1 \times (R1-R2)/((R2+R3) \times R1)$$

Accordingly, the input impedance Z5 can be expressed by the following formula.

$$Z5 = V1/I5 = ((R2+R3) \times R1)/(R1-R2) \quad (4)$$

From the formula (4), the input impedance Z5 looked from the power source P1 shows an infinite sized impedance in the case that R1=R2, as same as in the first embodiment. Therefore, if R1=R2 is satisfied, the impedance circuit shown in FIG. 5 becomes an ideal high impedance circuit whose input impedance Z5 is infinite.

Actually, however, in the high impedance circuit in FIG. 5, the condition R1=R2 cannot fulfilled completely, either. It is because, for example, the resistance values are not uniform in the manufacturing process, and the resistance changes occur by the changing temperature. Therefore, in the high impedance circuit in FIG. 5, as same as in the high impedance circuit shown in FIG. 2, it is necessary to be cautious as to the absolute values of the resistance value R1 of the negative resistance element (a resistance element between emitters) R1 and the resistance value R2 of the collector resistance element R2. Namely, in the high impedance circuit according to the second embodiment shown in FIG. 5, as well as in the high impedance circuit according to the first embodiment, since the polarity of the composite impedance is determined by the difference of the absolute values of the resistance values R1 and R2, the condition R1>R2 in the above formula (2) is necessary.

In the high impedance circuit in FIG. 5, a DC off-set arises at the both ends of the resistance elements R3 by the current source circuit I1. It is possible to bias between the base and the collector of the transistors Q1 and Q2 by using this off-set.

Generally, when assuming that R3=k×R2, the input impedance Z5=(k+1)×Z1 as shown in formula (5) from the formulas (4) and (1).

$$Z5 = ((R2 + K \times R2) \times R1)/(R1 - R2) \quad (5)$$
$$= (k+1) \times R2 \times R1 / (R1 - R2)$$
$$= (k+1) \times Z1$$

Namely, the input impedance Z5 in the high impedance circuit shown in FIG. 5 becomes the input impedance Z1 in the high impedance circuit shown in FIG. 2 being multiplied by (k+1).

The base bias of the transistors Q1 and Q2 are shown in the formula (6) below.

$$(\text{the base bias of } Q1 \text{ and } Q2) = Vcc - I0 \times R2 \times (R2+R3). \quad (6)$$

The base bias of the high impedance circuit shown in FIG. 2 fulfills the condition (the base bias of Q3 and Q4)=Vcc−I0×R2 as shown in the formula (3), therefore, the base bias of the high impedance circuit shown in FIG. 5 becomes lower by exactly I1×(R2 +R3) than the base bias of the high impedance circuit shown in FIG. 2.

The characteristics of the input impedance Z5 of the high impedance circuit in FIG. 5 also becomes similar to the characteristics regularized to ω=|R1|/|R2| shown in FIG. 4.

As described above, in the second embodiment of the high impedance circuit of the present invention, the high impedance circuit is also equivalently configured by using the negative resistance element 2R1 which connects the emitters of transistor Q1 and Q2 forming a differential-pair type circuit.

The high impedance circuit in FIG. 5 does not use npn-type transistors Q3 and Q4 and utilizes resistance elements R3 and R3 comparing with the high impedance circuit in FIG. 2, that is, two transistors are removed.

Other characteristics and the effects of the high impedance circuit of the second embodiment are the same as the high impedance circuit of the first embodiment.

Third Embodiment

The high impedance circuit according to a third embodiment of the present invention will be explained.

Figure 7:
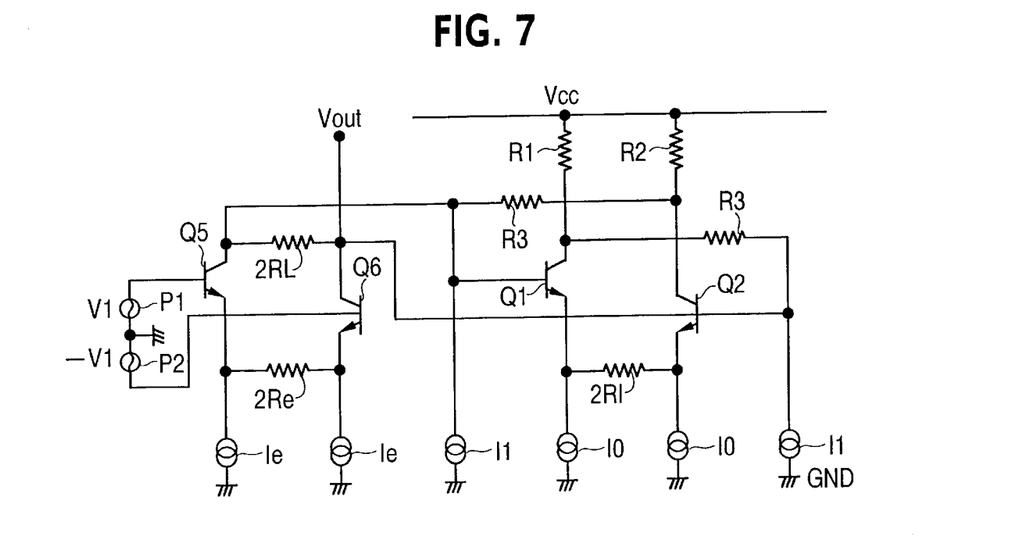
FIG. 7 is a circuit diagram of a high gain amplifier as a third embodiment of the high impedance circuit of the present invention.

FIG. 7 is a circuit diagram of a high impedance circuit according to the third embodiment of the high impedance circuit of the present invention, more specifically, a circuit diagram of a high impedance circuit and a high gain amplifier.

The circuit configuration of the high gain amplifier shown in FIG. 7 will be explained. This high impedance circuit contains a second differential-pair type circuit composed of npn-type transistors Q5 and Q6 which are added at the previous stage of the high impedance circuit shown in FIG.

5. This is done so that the circuit may function as a high gain amplifier in addition to functioning as a high impedance circuit. Also in this second differential-pair type circuit, a negative resistance element 2Re is connected between the emitters of the transistors Q5 and Q6, and a negative resistance element 2RL is provided between the collectors of the transistors Q5 and Q6. A fifth current source circuit Ie is connected between the emitter of the transistor Q5 and the second potential power source GND, and a sixth current source circuit Ie, which is the same as the fifth current source circuit Ie, is connected between the emitter of the transistor Q6 and the second potential power source GND.

In FIG. 7, the AC power sources P1 and P2 are provided between the bases of the transistors Q5 and Q6 in order to supply differential input signals vin and −Vin, in the same way as in FIGS. 3 and 5.

The transfer function of the high gain amplifier in the high impedance circuit in FIG. 7 will be expressed in the formula (7) below.

$$Vout/Vin = 1/(1/RL + 1/(R2 \times R1)/(R1 - R2))/Re \qquad (7)$$

$$= RL/Re$$

$$\because RL \ll (R2 \times R1)/(R1 - R2)$$

As is clear from the formula (7), if the input impedance of a high impedance circuit portion which is equivalent to the high impedance circuit in FIG. 5 is larger enough than the load resistance RL in the circuit in FIG. 7, it can be found that the gain is determined by the ratio RL/Re to the emitter resistance Re on the input side.

Furthermore, a bias current does not flow in the load resistance 2RL so that a DC shift does not occur. Accordingly, it is possible to expand within the range not exceeding the input impedance of the high impedance circuit portion. Therefore, the circuit shown in FIG. 7 can configure a high gain amplifier other than a high impedance circuit with fewer circuit elements.

Other characteristics and the effects of the high impedance circuit of the third embodiment are the same as that in the first and the second embodiments.

Fourth Embodiment

A high impedance circuit of a fourth embodiment of the present invention will be explained.

Figure 8:
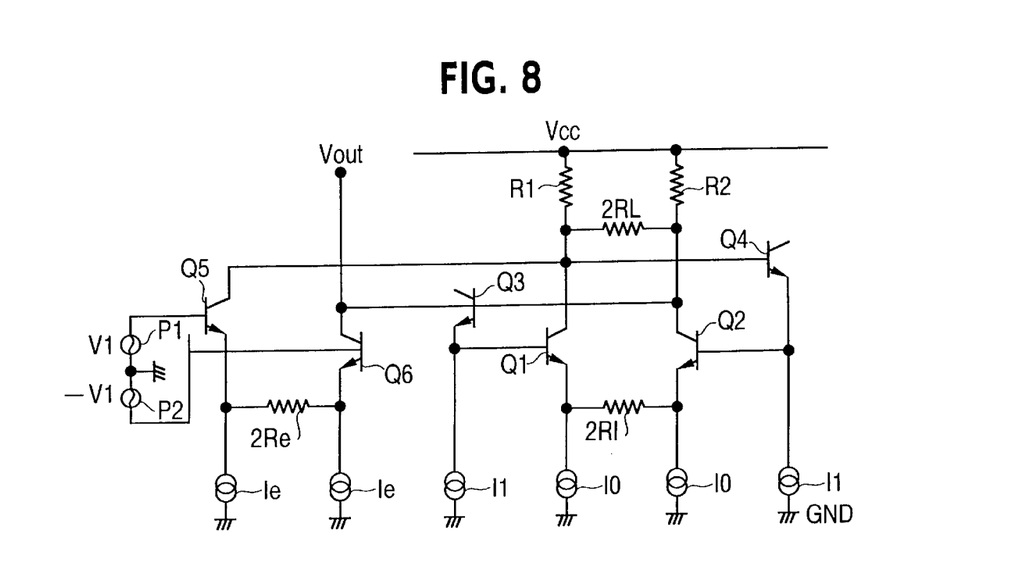
FIG. 8 is a circuit diagram of a high gain amplifier as a fourth embodiment of the high impedance circuit of the present invention.

FIG. 8 is a circuit diagram of a high impedance circuit according to the fourth embodiment of the present intention, more specifically, a circuit diagram of a high impedance circuit and a high gain amplifier.

The circuit configuration of the high gain amplifier shown in FIG. 8 will be explained.

The high impedance circuit shown in FIG. 8 is added a second differential-pair type circuit composed of npn-type transistors Q5 and Q6 in the same way as in the circuit in FIG. 7, at the preceding stage of the high impedance circuit shown in FIG. 2 in order to also function as a high gain amplifier besides functioning as a high impedance circuit. In this second differential-pair type circuit, a resistance element 2Re is also provided between the emitters of the transistors Q5 and Q6. The fifth current source circuit Ie is connected between the emitter of the transistor Q5 and the second potential power source GND, and the fifth current source circuit Ie is connected between the emitter of the transistor Q6 and the second potential power source GND.

However, being different from the circuit shown in FIG. 7, a resistance element 2RL is connected between the collectors of the transistors Q1 and Q2 in the circuit in FIG. 8.

In FIG. 8, as same in FIG. 7, AC power sources P1 and P2 are provided between the bases of the transistors QS and Q6 in order to supply differential input signals Vin and −Vin.

A transfer function of the high gain amplifier portion of the circuit in FIG. 8 is shown in the formula (8) below.

$$Vout/Vin = 1/(1/RL + 1/(R2 \times R3) \times R1)/(R1 - R2))/Re \qquad (8)$$

$$= RL/Re$$

$$\because RL \ll ((R2 + R3) \times R1/(R1 - R2)$$

As is clear from the formula (8), if the input impedance of the high impedance circuit portion is larger enough than the resistance value RL of the resistance element, it can be found that the gain is determined by the ratio RL/Re to the emitter resistance Re on the input side.

In the circuit in FIG. 9 also, a bias current does not flow in the resistance element 2RL so that a DC shift does not occur. Accordingly, it is possible to expand within the range that does not exceed the input impedance of the high impedance circuit portion. Accordingly, the circuit in FIG. 8 is a circuit which can configure a high gain amplifier with fewer circuit elements.

The other characteristics and the effects of the high impedance circuit of the fourth embodiment is the same as the in the first to third embodiments explained above.

Note that the present invention is not limited to the above embodiments and includes various modifications.

For example, in the embodiments described above, an example was given as to a high impedance circuit for specially high speed operation when configuring a differential-pair type circuit and a buffer circuit using a bipolar transistors, however, differential-pair type circuit and a buffer circuit can be configured using an FET in the present invention.

Furthermore, as a preferred embodiment, an example was given as to a bipolar transistor using an npn-type transistor, however, a high impedance circuit can be configured by using pnp-type transistors in the present invention.

According to the basic circuit of the high impedance circuit of the present invention, since a high impedance circuit is equivalently configured by using a negative resistance element, the whole circuit can be structured in an IC by using one kind of transistors, that is, only npn-type transistors.

Especially, for example, a DC power source by one kind of transistor such as a pnp-type transistor is not necessary, so that a wide dynamic range can be secured and consequently can be operated at a low voltage.

Also, according to the high impedance circuit of the present invention, being a high impedance, it can give a bias at a time. Furthermore, since there is an advantage that the differentiality is obtainable, it is possible to raise the amplifier gain drastically and a high gain amplifier can be realized with a low power consumption. Therefore, the high impedance circuit of the present invention can be expected a low power consumption and a reduction of an IC chip size, so that the IC cost, and the manufacturing cost can be largely reduced.

Also, according to the high impedance circuit of the present invention, a resistance element of a zero bias current can be obtained by connecting a resistor between high impedance biases, so that a high gain circuit, which has been difficult to be realized, can be configured. Accordingly, according to the high impedance circuit of the present invention, a gain can be raised per an amplifier stage and the number of IC elements can be reduced, an SN can be improved and the size can be reduced.

From the above explanation, the high impedance circuit of the present invention brings the advantages such as an improvement of commodity qualities, reduction of manufacturing costs and the reduction of substrate areas.

Also, by producing a high impedance bias in the high impedance circuit of the present invention, the applicable range can be expand to be able to be used for a phase-locked loop circuit (PLL) an amplitude wave detection circuit (AMDET), a frequency wave detection circuit (FMDET), and a filter circuit (FILTER), etc., wherein a high frequency signal is handled.

What is claimed is:

1. A high impedance circuit, comprising:

a first transistor;

a first resistance element connected between a collector of the first transistor and a first voltage power supply line;

a first current source connected between an emitter of the first transistor and a second power supply line (ground);

a second transistor having a same conductivity as the first transistor;

a second resistance element connected between a collector of the second transistor and the first voltage power supply line and having a resistance value same as that of the first resistance element;

a second current source connected between an emitter of the second transistor and the second power supply line (ground) and being equal to the first current source;

a third resistance element connected between the emitter of the first transistor and the emitter of the second transistor;

a third transistor, having a base connected to a collector of the second transistor and an emitter connected to a base of the first transistor, said third transistor having the same conductivity of the first transistor;

a third current source circuit connected between an emitter of the third transistor and the second power supply line (ground);

a first buffer circuit element connected between a collector of the second transistor and a control terminal of the first transistor; and a second buffer circuit element connected between a collector of the first transistor and a control terminal of the second transistor.

said second buffer circuit further comprising a fourth transistor, having a base connected to a collector of the first transistor and an emitter connected to a base of the second transistor, said fourth transistor having the same conductivity of the second transistor;

a fourth current source circuit connected between an emitter of the fourth transistor and the second power supply line (ground), said fourth current source circuit being equal to said third current source circuit;

wherein said third resistance element has a resistance value being twice as high as either first or second resistance elements.

2. A high impedance circuit according to claim 1, further comprising:

a fifth transistor having a collector connected to the collector of the first transistor and a base of the fourth transistor, and having a same conductivity of the first transistor;

a sixth transistor having a collector connected to the collector of the second transistor and the base of the third transistor and having a same conductivity as the fifth transistor;

a fifth current source circuit connected between the emitter of the fifth transistor and the second voltage source;

a sixth current source circuit connected between the emitter of the sixth transistor and the second voltage source;

a sixth resistance element connected between the emitter of the fifth transistor and the emitter of the sixth transistor; and a seventh resistance element connected between the collector of the first transistor and the collector of the second transistor.

3. A high impedance circuit according to claim 2, further comprising:

a ratio of the resistance value of the sixth resistance element and the resistance value of the fifth resistance element is configurable to set a desired amplification of the circuit.

* * * * *